United States Patent

Graeger et al.

[11] Patent Number: 5,164,338
[45] Date of Patent: Nov. 17, 1992

[54] METHOD OF MANUFACTURING A POLYCRYSTALLINE SEMICONDUCTOR RESISTANCE LAYER OF SILICON ON A SILICON BODY AND SILICON PRESSURE SENSOR HAVING SUCH A RESISTANCE LAYER

[75] Inventors: Volker Graeger, Buchholz; Rolf U. D. Kobs, Tornesch; Horst Schäfer, Hannoversch Münden; Heinrich Zeile, Hamburg, all of Fed. Rep. of Germany

[73] Assignee: U.S. Philips Corporation, New York, N.Y.

[21] Appl. No.: 605,211

[22] Filed: Oct. 24, 1990

Related U.S. Application Data

[62] Division of Ser. No. 344,199, Apr. 27, 1989, Pat. No. 4,984,046.

[30] Foreign Application Priority Data

Apr. 28, 1988 [DE] Fed. Rep. of Germany ....... 3814348

[51] Int. Cl.⁵ .......................................... H01L 21/4763
[52] U.S. Cl. ................................ 437/233; 437/901; 437/918; 437/109; 437/967
[58] Field of Search ............... 437/233, 901, 918, 81, 437/109, 980, 101, 967

[56] References Cited

U.S. PATENT DOCUMENTS

| | | | |
|---|---|---|---|
| 3,558,374 | 1/1971 | Boss et al. | 437/967 |
| 4,178,674 | 12/1979 | Liu et al. | 437/918 |
| 4,379,020 | 4/1983 | Glaeser et al. | 437/233 |
| 4,413,403 | 11/1983 | Ariizumi | 437/69 |
| 4,446,613 | 5/1984 | Beinglass et al. | 437/918 |
| 4,742,020 | 5/1988 | Roy | 437/233 |
| 4,781,766 | 11/1988 | Barnett et al. | 437/233 |
| 4,877,753 | 10/1989 | Freeman | 437/233 |

FOREIGN PATENT DOCUMENTS

| | | |
|---|---|---|
| 59-138384 | 8/1984 | Japan . |
| 61-85815 | 5/1986 | Japan . |
| 1-25515 | 1/1989 | Japan ................... 437/967 |

OTHER PUBLICATIONS

Ghardhi, S., *VLSI Fabrication Principles*, John Wiley & Sons, N.Y., p. 230, 1983.
Wolf, S., et al., *Silicon Processing for the VLSI Era*, vol. 1, Lattice Press, Calif., pp. 163, 335.

*Primary Examiner*—Olik Chaudhuri
*Assistant Examiner*—G. Fourson
*Attorney, Agent, or Firm*—Norman N. Spain

[57] ABSTRACT

The invention relates to a method of manufacturing a polycrystalline semiconductor resistance layer of silicon on a silicon body. First an insulating layer is formed on the silicon body and then a polycrystalline silicon layer is deposited. To the deposited polycrystalline silicon layer is applied a further polycrystalline silicon layer having a crystallite structure coarser with respect to that of the first polycrystalline silicon layer. The two polycrystalline silicon layers are additionally doped.

12 Claims, 1 Drawing Sheet

METHOD OF MANUFACTURING A POLYCRYSTALLINE SEMICONDUCTOR RESISTANCE LAYER OF SILICON ON A SILICON BODY AND SILICON PRESSURE SENSOR HAVING SUCH A RESISTANCE LAYER

This is a division of application Ser. No. 344,199, filed Apr. 27, 1989, now U.S. Pat. No. 4,984,046.

BACKGROUND OF THE INVENTION

The invention relates to a method of manufacturing a polycrystalline semiconductor resistance layer of silicon on a silicon body, in which first an insulating layer is formed on the silicon body and then a polycrystalline silicon layer is deposited, which layer is then doped. The invention further relates to a silicon pressure sensor having such a resistance layer.

Such a method is known from the article "Silicium-Drucksensor für hohe Betriebstemperaturen" by E. Obermeier and F. von Kienlin, Proc. Sensor 85, Transducer-Technik: "Entwicklung und Anwendung", Karlsruhe, 1985, pp. 4.3.1 to 4.3.12. In this case, a resistance layer of polycrystalline semiconductor silicon is applied to a pressure sensor, which consists of a silicon body and, which is arranged on a carrier. The silicon body has a cavity in the form of a blind hole, as a result of which a diaphragm is formed. The structured resistance layer is applied to the outer surface of the diaphragm.

During the manufacture of the resistance layer, an oxide layer (silicon dioxide) is formed an insulating layer on the diaphragm by thermal oxidation. Subsequently, a deposition of a polycrystalline silicon layer by Low Pressure Chemical Vapour Deposition (LPCVD) takes place with silane the reaction gas in a conventional diffusion oven. The layer is then doped by ion implantation and the resistance layer obtained is structured after a thermal curing process by means of a photoetching process. The resistance layer is contacted by vapor deposition and structuring of an aluminum layer. The crystallites obtained by thermal curing in the polycrystalline layer have an average grain diameter of 80 nm to 200 nm.

The measure of the sensitivity of expansion of a resistor R is its k factor, which indicates the relative resistance variation dR/R per expansion e:

$$dR/R = k\ e.$$

The resistance layer manufactured by means of the method described above has a k factor between 27 and 35.

Instead of a curing process after deposition of the polycrystalline layer, as proposed in the aforementioned publication, after deposition also a laser recrystallization also be used for forming enlarged crystallites (grains), as is known from the "Laser-Recrystallized Polysilicon Resistors for Sensing and Integrated Circuits Applications" by J. Binder, W. Henning, E. Obermeier, H. Schaber and D. Cutter, Sensors and Actuators, 4, 1983, pp. 527 to 536. In this case, the deposited polycrystalline silicon layer is fused for a short time in the focus of a laser. During the solidification of the fused silicon, enlarged crystallites are formed having an average grain diameter between 1000 nm and 10,000 nm. The k factor for the polycrystalline layer manufactured by means of the laser-recrystallization lies between 45 and 55. It is found therefore that the sensitivity to expansion of the resistance layer depends upon the size of the crystallites. The laser recrystallization is very complicated, however, because the whole surface of the polycrystalline silicon layer must be fused pointwise. In order that the light energy of the laser can be coupled into the silicon layer, the polycrystalline silicon must moreover be covered by an additional transparent nitride layer. This nitride layer provides mechanical stabilization of the liquid polycrystalline layer during the laser scanning and an antireflex coating, in order that the light is not reflected by the silicon layer.

SUMMARY OF THE INVENTION

A principal object of the invention is to provide a method that can be carried out in a simple manner for manufacturing a polycrystalline semiconductor resistance layer of silicon on a silicon body, layer has a k factor of more than 35.

According to the invention, this object is achieved in a method of the kind described in the opening paragraph in that to the deposited polycrystalline silicon layer (first polycrystalline silicon layer) there is applied a further polycrystalline silicon layer to be doped and which has a coarser crystallite structure as compared with that of the first polycrystalline layer.

In the present method, the polycrystalline layer deposited on the insulating layer serves as a nucleation layer for the additional polycrystalline layer. The layer applied to the insulating layer may be fine crystalline and partly also amorphous. During the deposition of the additional polycrystalline layer, for example, in an epitaxial processing step, the polycrystalline provided on the insulating layer is thermally cured and serves as a starting means for forming larger crystallites in the additional polycrystalline layer.

The term "epitaxy" is to be understood in general sense to mean an orientated crystal intergrowth (compare Römpps Chemisches Wörterbuch, Deutshcer Taschenbuchverlag, Munich 1974) and especially the monocrystalline growth of a layer onto a monocrystalline substrate (compare D. Widmann, H. Mader, H. Friedrich, Technologie hochintegrierter Schaltungen, Springer Verlag 1988). In the present case, the term "epitaxy" is used in its general meaning.

On layers, which are not adapted to the crystalline silicon, such as the insulating layer, during an eptiaxial growing process a coarse-crystalline growth of individual crystallites takes place, which are atmost insufficiently connected to each other. This formation of incoherent crystallites is due to the absence of suitable growing conditions.

By means of the processing step of depositing a polycrystalline layer on the insulating layer, suitable crystals are formed for a coherent growth of larger crystallites. This first deposited layer forms a continuous silicon layer, which is highly amorphous or consists of very fine crystallites. This layer is thermally cured during the epitaxial growth of the additional polycrystalline layer. Therefore, a fine-crystalline recrystallization of the first deposited nucleation layer is obtained. During the epitaxy silicon deposition, the silicon atoms find a sufficient number of energetic positions to become located in crystallized regions of the nucleation layer. Since not all crystal orientations grow at a uniform speed in this method, only the preferentially growing orientations occur and a coarser crystalline structure is obtained. The lateral average grain diameter of the crystallites lies between 1000 nm and 5000 nm. The k factor, i.e. the measure for the sensitivity to expansion of this resistance layer, lies between 43 and 52.

This method of the invention can therefore be carried out in a considerably simpler manner than the known method of laser recrystallization and the resistance layer manufactured by means of this method has a similar high k factor. As has further been found, the resistance layer according to the invention has an equally high mobility as monocrystalline silicon.

DETAILED DESCRIPTION OF THE INVENTION

Figure 1:
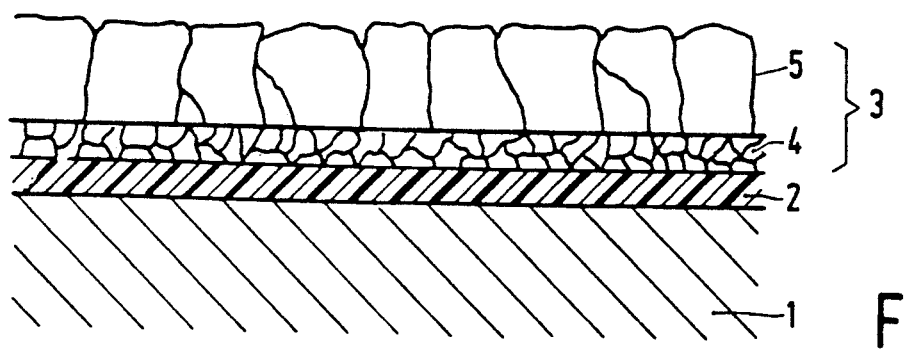
FIG. 1 is a diagrammatic cross-sectional view of a silicon body provided with layers of polycrystalline silicon according to the invention.
Figure 2:
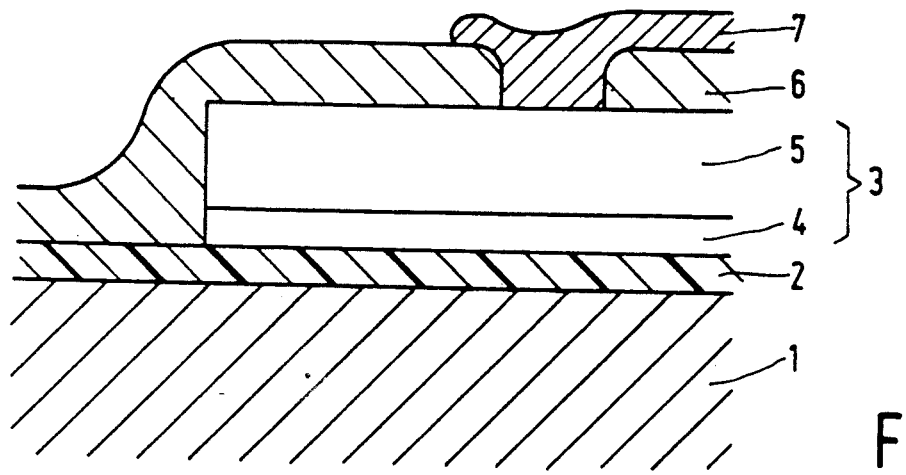
FIG. 2 is a cross-sectional view of a silicon body provided with resistance layers of polycrystalline silicon as shown in FIG. 1 further contacted with a passivation layer and a conductive layer.

For a complete understanding, the invention will now be described in greater detail.

The first deposited polycrystalline silicon layer is preferably deposited on the insulating layer by means of chemical or physical vapour deposition. In the case of Low-Pressure Chemical Vapour Deposition (LPCVD), the surface to be coated is subjected in a conventional diffusion oven to a gas current, which contains, for example, silicon tetrachloride (SiCl4) or silane (SiH4). The silicon contained in the gas is deposited on the surface to be coated. The deposition takes place at temperatures between 550° C. and 700° C. The deposition is effected at a pressure between 0.1 mbar and 0.3 mbar, preferably at a pressure of 0.19 mbar. It should be terminated at the earliest when a thin coherent layer has formed. In fact, only then the required growing conditions for the larger crystallites of the additional polycrystalline layer are present.

This polycrystalline layer may also be deposited on the insulating layer by cathode sputtering. In this case, high energy rare gas ions of strike in vacuo, a cathode, which consists of the material to be applied by sputtering, and release uncharged atoms or molecules, which are deposited on the substrate (silicon body).

The additional polycrystalline layer is preferably applied by deposition from the gaseous phase. In an oven at temperatures of more than 1000° C., the polycrystalline (nucleation layer) deposited on the insulating layer is subjected to a gas current, which contains silicon atoms. The silicon atoms are applied to the nucleation layer by vapor deposition. At the same time, the nucleation layer is moreover thermally cured.

The insulating layer consists either of silicon dioxide or of silicon nitride. The silicon dioxide can be formed on the silicon body by thermal oxidation. A gas current, which contains oxygen and hydrogen, flows into an oven, which was heated to a temperature of about 1000° C. In this oven, the insulating layer of silicon dioxide grows onto the silicon body. The insulating layer of silicon nitride can be formed by deposition from the gaseous phase at low pressure (LPCVD).

The doping of the resistance layer of polycrystalline silicon can be effected by ion implantation after the further polycrystalline silicon layer has been applied. In this processing step, ionized atoms of the dopant are accelerated in an electric field and shot (implanted) into the crystal lattice of the silicon. Subsequently, a recrystallization takes place at a temperature lying between 800° C. and 1200° C. As dopants phosphorus, boron and arsenic can be used.

The doping can also be effected by addition of dopants during the application of the polycrystaline silicon layers.

In an additional embodiment of the method according to the invention, the resistance layer is structured by etching after the additional polycrystalline silicon layer has been applied, a passivation layer is then applied, which is provided with windows for electrical contacts by photolithography, and finally a conductive metal layer is applied for contacting purposes.

The resistance layer manufactured and contacted according to the method in accordance with the invention is particularly suitable for use in a silicon pressure sensor because it can be applied in a simple manner to the silicon body and has a high sensitivity to expansion.

A silicon pressure sensor manufactured more particularly by means of the method according to the invention and comprising a silicon body which is provided on a carrier and has, at its major surface remote from the carrier, an insulating layer and a cavity which is opened on the side of the carrier, has the form of a blind hole and forms a diaphragm, its surface remote from the cavity in the form of a blind hole being provided with four resistance elements consisting of a semiconducting, doped polycrystalline silicon resistance layer, a passivation layer provided on the polycrystalline resistance layer and a structured metal layer provided on the passivation layer and electrically contacting the polycrystalline resistance layer, is characterized in that the polycrystalline resistance layer consists of a first polycrystalline doped silicon layer and an additional doped polycrystalline silicon layer provided in a subsequent processing step on the first polycrystalline silicon layer with a crystallite structure coarser with respect to that of the first polycrystalline silicon layer.

According to advantageous further embodiments of the silicon pressure sensor in accordance with the invention, the silicon body is quadrangular and the diaphragm formed in the silicon body by means of the cavity in the form of a blind hole is circular.

According to a further advantageous embodiment of the silicon pressure sensor, the resistance elements have pairwise a different geometrical form, each time two resistance elements, having corresponding geometrical forms are arranged diametrically opposite to each other forms.

Advantageously, one pair of resistance elements are arranged as parallel longitudinal strips at the center of the diaphragm, while the other pair of resistance elements are in the form of U-shaped strips and arranged at the outer edge of the diaphragm in such a manner that the limbs of the U-shaped strips are directed either towards the outer edge of the silicon body or towards the center of the diaphragm.

According to further advantageous embodiments of the silicon pressure sensor in accordance with the invention, the first polycrystalline silicon layer is a layer deposited by means of Chemical Vapor Deposition, more particularly at low pressure, or a layer deposited by cathode sputtering; it preferably has at least such a thickness that a coherent layer is formed; preferably, the thickness is about 100 nm.

According to a further advantageous embodiment of the silicon pressure sensor in accordance with the invention, the additional polycrystalline layer is a layer deposited from the gaseous phase with crystallites having an average lateral grain diameter in the range of from 1000 nm to 5000 nm and preferably has a thickness in the range of from 300 nm to 1000 nm.

According to further advantageous embodiments of the silicon pressure sensor in accordance with the invention, the silicon body is rigidly connected to the support by anodic bonding, the support preferably being a glass plate.

According to an advantageous further embodiment of the silicon pressure sensor in accordance with the invention, the metal layer electrically contacting the resistance layer consists of aluminum.

According to still further embodiments of the pressure sensor in accordance with the invention, the insulating layer and the passivation layer are oxide layers formed by thermal oxidation of the silicon body, or these layers are silicon nitride layers.

In order that the invention may be readily carried out, it will now be described more fully, by way of example, with reference to the figures of the drawing.

FIG. 1 shows a diagrammatic cross-section of a silicon body 1 with an insulating layer 2 and a polycrystalline semiconductor resistance layer 3 of silicon. Prior to the manufacture of such a polycrystalline layer 3, the insulating layer may be formed on the silicon body 1 by thermal oxidation. For this purpose the silicon body 1 is arranged in an oxidation oven, which has been heated to a temperature of about 1000° C. A mixture of oxygen and hydrogen flows for about half an hour into the oven. Three liters of oxygen gas and three liters of hydrogen gas flow into the oven per minute. After termination of the thermal oxidation, a 100 nm thick layer 2 of silicon dioxide has been grown thermally.

An insulating layer of silicon nitride may also be formed by the Low-Pressure Chemical Vapor Deposition (LPCVD) to be described hereinafter.

In the next processing step, the silicon body 1 coated with the insulating layer 2 is introduced into a commercially available diffusion oven and a first polycrystalline layer 4 of the resistance layer 3 is applied to the insulating layer 2 by Low-Pressure Chemical Vapor Deposition (LPCVD). The oven has a temperature of 600° C. to 700° C., for example 610° C. The surface of the insulating layer 2 to be coated is subjected to a gas current containing a carrier gas if nitrogen and hydrogen is a further silicon-containing gas, for example silicon tetrachloride (SiCl$_4$) or silane (CSiH$_4$). The silicon contained form the gas is deposited on the surface of the insulating layer 2 to be coated. In this process, the pressure lies between 0.1 mbar and 0.3 mbar, preferably at 0.19 mbar. The deposition is not terminated until the polycrystalline layer 4 covers the insulating layer 2 as a thin coherent layer. The thickness of the layer 4 may be, for example, 100 nm. The layer 4 applied on the insulating layer 2 may be fine-crystalline and also partly amorphous. This layer 4 serves as a nucleation layer for a further polycrystalline silicon layer 5 with larger crystallites to be applied in the next processing step.

The polycrystalline silicon layer 4 may also be formed by cathode sputtering. The cathode sputtering method is a coating method carried out in vacuo to coat a substrate (in this case: the silicon body 1 with an insulating layer 2) with a thin layer (in this case: polycrystalline silicon layer 4). In this case, rare earth ions of high energy in vacuo strike a cathode, which consists of the material to be applied by sputtering, and release uncharged atoms or molecules, which are deposited on the silicon body 1 provided with the insulating layer 2.

Conventional methods besides cathode sputtering are ion beam sputtering and plasma sputtering.

After the polycrystalline layer 4 has been applied, the silicon body 1 is introduced into an epitaxy reactor. Thus, the silicon body is inserted into an epitaxy reactor. Thus the silicon body is inserted into a quartz tube, which is heated to a temperature lying between 1000° C. and 1300° C., for example 1200° C. and is subjected to a gas current, which contains as a carrier gas hydrogen and as a silicon source a further gas, which may consist, for example, of silicon tetrachloride (SiCl$_4$) or silane (SiH$_4$). The silicon contained in the gas is deposited on the polycrystalline silicon layer 4 and forms an additional polycrystalline silicon layer 5. The epitaxy process is terminated with the layer thickness of the polycrystalline layer 5 is 300 to 1000 nm. In a practical embodiment, a layer thickness of 700 nm is chosen.

The polycrystalline silicon layer 4, which may be amorphous for a large part, is thermally cured during this step of epitaxially growing the additional polycrystalline silicon layer 5. A fine-crystalline recrystallization of the polycrystalline layer 4 acting as a nucleation layer is obtained. During the silicon deposition by epitaxy, the silicon atoms find sufficient energetically favorable positions so that they can be located at crystallites of the polycrystalline silicon layer 4. Only the preferentially growing orientations are then obtained and a polycrystalline silicon layer 5 having a coarser crystalline structure is formed. The lateral average grain diameter lies between 1000 nm and 5000 nm.

The doping of the resistance layer 3 can be effected in different ways. Dopants can be added immediately upon the application of the polycrystalline silicon layers 4 and 5. The gas currents then contain these dopants.

Another kind of doping is ion implantation. In this processing step, ionized atoms of the dopant are accelerated in an electrical field and shot (implanted) into the crystal lattice of the silicon. Since due to the ion bombardment the crystal lattice is partly destroyed, a recrystallization must then take place at a temperature lying between 500° C. and 1000° C. As dopants preferably phosphorous, boron and arsenic are used. In an embodiment, as a dopant, boron was used in a concentration of $8.10^{14}$ cm$^{-2}$ and annealed at 1000° C. in nitrogen.

A measure for the sensitivity to expansion of a resistor R is its k factor, which indicates the relative resistance variation dR/R per expansion e:

$$dR/R = k\ e.$$

Resistance layers manufactured by means of the method according to the invention have a k factor between 43 and 52. The resistance layer 3 manufactured according to the embodiment has a k factor of 52, a resistivity of 24 m n/cm, a temperature coefficient of the resistivity of −0.01% K. The temperature coefficient of the k factor is −0.15% K.

For contacting the resistance layer 3, first a passivation layer 6, for example of silicon nitride or silicon dioxide, is applied by thermal oxidation. By a conventional photolithographic processing step, subsequently windows are provided in the passivation layer 6 to the resistance layer 3 and then an electrically conductive metal layer 7, for example of aluminum, is applied by vapor deposition. This metal layer 7 contacts the resistance layer 3. It can also be structured photolithographically.

Figure 3:
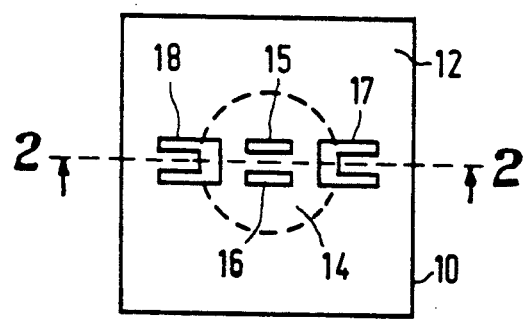
FIG. 3 is a view of a silicon pressure sensor having resistance layers.
Figure 4:
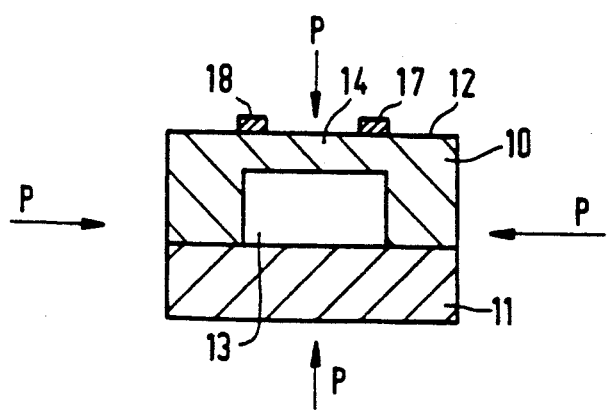
FIG. 4 is a longitudinal sectional view of the pressure sensor of FIG. 3 taken in plane 11—11.

The resistance layer 3 manufactured by means of the method according to the invention is more particularly suitable for use in a silicon pressure sensor. Such a silicon pressure sensor is shown in FIG. 3 and 4. This pressure sensor 12 comprises a cubic silicon body 10, which is contacted to a carrier 11, for example by anodic bonding. The carrier 11 may be, for example, a glass plate. The silicon body 10 is provided with a cavity 13 in the form of a blind hole, which has a circular cross-section and is opened on a surface of the carrier 11. Due to this cavity 13, a circular diaphragm 14 is formed, on which four resistance elements 15, 16, 17 and 18 are arranged.

The resistance elements 15 and 16 are arranged as parallel longitudinal strips at the center of the diaphragm 14. The resistance elements 17 and 18 are formed as U-shaped strips and are arranged at the outer edge of the diaphragm 14 diametrically opposite to each other in such a manner that the openings of the U-shaped strips point towards the outer edge of the silicon body 10. The U-shaped openings of the resistance elements 17 and 18 could also point towards the diaphragm 14. The four resistance elements 15 to 18 consist of the silicon layers 4 and 5 forming the resistance layer 3 and have been applied to the silicon body 10 by means of the method described hereinbefore.

The sequence of polycrystalline layers manufactured by means of the method according to the invention may also be used for the manufacture of semiconductor elements. In all cases in which layers recrystallized by a laser beam are used or can come into consideration, polycrystalline layers manufactured by means of the present method could be used, for example in the manufacture of thin-film transistors on quartz substrates.

We claim:

1. A method of manufacturing a polycrystalline semiconductor resistance layer of silicon on a silicon body, said method consisting essentially of depositing an insulating layer on said silicon body, depositing a first polycrystalline silicon layer on said insulating layer, depositing on said first polycrystalline silicon layer a second polycrystalline silicon layer, said second polycrystalline silicon layer being formed of crystallites larger than those of said first polycrystalline silicon layer and doping both polycrystalline silicon layers during or after the deposition of said silicon layers.

2. A method as claimed in claim 1, characterized in that the first polycrystalline silicon layer is deposited on the insulating layer by means of chemical or physical vapor deposition.

3. A method as claimed in claim 2, characterized in that the first polycrystalline silicon layer is deposited on the insulating layer by means of Low-Pressure Chemical vapor Deposition (LPCVD).

4. A method as claimed in claim 3, characterized in that the deposition takes place at a pressure lying between 0.1 mbar and 0.3 mbar.

5. A method as claimed in claim 2, characterized in that the first polycrystalline silicon layer is deposited on the insulating layer by means of cathode sputtering.

6. A method as claimed in claim 1, characterized in that the deposition of the first polycrystalline silicon layer is terminated as soon as a thin coherent layer has formed.

7. A method as claimed in claim 1, characterized in that the second polycrystalline silicon layer is applied by deposition from the gaseous phase.

8. A method as claimed in claim 1, characterized in that a silicon dioxide layer is formed by thermal oxidation on the silicon body as insulating layer.

9. A method as claimed in claim 1, characterized in that a silicon nitride layer is deposited on the silicon body as insulating layer by means of Low-Pressure Chemical Vapor Deposition (LPCVD).

10. A method as claimed in claim 1, characterized in that the doping takes place by ion implantation.

11. A method as claimed in claim 1, characterized in that the doping takes place during the application of the polycrystalline silicon layers by the addition of dopants.

12. A method as claimed in claim 1, characterized in that the resistance layer is structured by etching after the application of the second polycrystalline silicon layer, whereupon a passivation layer is applied, in which passivation layer windows for electrical contacts are then provided by photolithography, and finally a conductive metal layer is applied for contacting purposes.

* * * * *